United States Patent [19]

McClure

[11] Patent Number: 5,424,986
[45] Date of Patent: Jun. 13, 1995

[54] SEMICONDUCTOR MEMORY WITH POWER-ON RESET CONTROL OF DISABLED ROWS

[75] Inventor: David C. McClure, Carrollton, Tex.

[73] Assignee: SGS-Thomson Microelectronics, Inc., Carrollton, Tex.

[21] Appl. No.: 811,088

[22] Filed: Dec. 19, 1991

[51] Int. Cl.$^6$ .............................................. G11C 7/00
[52] U.S. Cl. .................. 365/200; 365/225.7; 365/226
[58] Field of Search ............ 365/226, 227, 200, 225.7; 307/272.3

[56] References Cited

U.S. PATENT DOCUMENTS

| 4,631,707 | 12/1986 | Watanabe | 365/226 |
|---|---|---|---|
| 4,879,679 | 11/1989 | Kikuda et al. | 365/226 |
| 4,905,199 | 2/1990 | Miyamoto | 365/226 |
| 4,933,902 | 6/1990 | Yamada et al. | 365/226 |
| 4,987,560 | 1/1991 | Hamano et al. | 365/230.06 |
| 5,121,358 | 6/1992 | Slemmer et al. | 365/226 |
| 5,250,456 | 10/1993 | Bryant | 437/47 |

FOREIGN PATENT DOCUMENTS 0085386 10/1983 European Pat. Off. .

OTHER PUBLICATIONS

Fink, et al., Electronics Engineers' Handbook, Second Edition, "Integrated Circuits and Microprocessors", (McGraw-Hill, 1982) pp. 8–98.

Primary Examiner—Joseph A. Popek
Assistant Examiner—Son Dinh
Attorney, Agent, or Firm—Rodney M. Anderson; Lisa K. Jorgenson; Richard K. Robinson

[57] ABSTRACT

An integrated circuit memory having redundant rows, for replacing a row in a primary array having a defective memory cell, is disclosed. For each primary row that is to be replaced, a fuse is opened between the output of the row decoder and the word line for the replaced row. A power-on reset circuit is provided in the memory for determining if the power supply voltage has reached an adequate voltage; if not, a transistor connected to each word line is turned on, biasing the word line to a de-energizing voltage. This ensures that the word lines for replaced rows do not power up in an "on" state.

19 Claims, 4 Drawing Sheets

SEMICONDUCTOR MEMORY WITH POWER-ON RESET CONTROL OF DISABLED ROWS

This invention is in the field of integrated circuits, and is more specifically directed to memory circuits having redundant elements therein.

BACKGROUND OF THE INVENTION

In the field of integrated circuits, particularly those containing relatively large memory arrays such as dynamic random access memories (DRAMs), static random access memories (SRAMs), various types of read-only memories, as well as microprocessors and other logic circuits containing memories, the use of redundant elements to replace defective memory cells has become widespread. In such circuits, redundant rows, redundant columns, or both, are provided that can be programmed, by way of fuses or antifuses, to be selected by the row or column address value corresponding to the defective element. Data is thus stored in and retrieved from the redundant element in lieu of the defective element when the programmed address is presented. As a result, the manufacturing yield of the integrated circuit can be significantly improved, particularly for large memory array devices having small feature sizes, where even a single extremely small defect would otherwise cause the entire memory to be non-saleable.

As is well known in the field, upon power-up of an integrated circuit, the voltages and logic states internal to the circuit can initially enter into an indeterminate state, especially considering the uncontrolled manner in which circuits may be powered up. Certain of these states are highly undesirable, and indeed can cause internal damage to the circuit. For example, in conventional SRAMs having word lines for connecting the memory cells in a selected row to one or a pair of bit lines, the possibility exists where multiple word lines can power-up in an on state. As a result, memory cells in different rows which are powered-up in complementary states can be connected to one another via the same bit line, resulting in excessive DC current being dissipated.

By way of further background, application Ser. No. 588,609, filed Sep. 26, 1990, now U.S. Pat. No. 5,121,358, assigned to SGS-Thomson Microelectronics, Inc. and incorporated herein by this reference, describes a memory which ensures that multiple word lines do not power-up into an energized state. In this memory, latched repeaters are included between sub-arrays in the memory, for allowing only the selected row in the selected sub-array to be energized, thus saving power in normal operation. The undesirable power-up state is avoided in this memory by the coupling of a power-on reset signal to each of the latched repeaters which forces all row line portions to a de-energized state on power-up, thus preventing against excessive DC power dissipation due to multiple memory cells being selected for a given bit line pair.

In the case of a memory having redundant rows, however, where more than one primary row to be replaced is disconnected from the row decoder by the opening of a fuse, it is possible that the memory may power-up with multiple disabled word lines in an on-state, even if the power-on reset pulse is used to control the row decoder or repeater. Especially considering that the replaced rows may contain defective memory cells that are shorted to a power supply voltage or to ground, the possibility of excessive power dissipation exists in such memories.

Referring now to FIG. 1, a portion of a row decoder constructed and controlled according to the prior art will now be described in detail. This conventional decoder receives predecoded input signals PDA (one-of-eight), PDB (one-of-four) and PDC (one-of-eight) for selecting one of 256 word lines $WL_0$ through $WL_{255}$ according thereto. Word lines $WL_0$ through $WL_{255}$ are grouped in pairs, and are driven by shared NAND gates $40_0$ through $40_{127}$ which receive the predecoded input signals PDA, PDB, PDC.

The construction of shared NAND gate $40_0$ is illustrated in further detail in FIG. 1. Predecoded signal $PDA_0$ is received at the gates of p-channel transistor 48a and n-channel transistor 49a which have their source/drain paths connected in series; the output of shared NAND gate $40_0$ that is for driving word line $WL_0$ is coupled to the common drain node of transistors 48a, 49a. P-channel transistors 54a, 55a have their source/drain paths connected in parallel with transistor 48a, and have their gates connected to receive predecoded signals $PDC_0$, $PDB_0$, respectively. N-channel transistors 50, 52 have their source/drain paths connected in series with that of transistor 49a, between the common drain node and ground. Transistors 50, 52 are also shared by the portion of shared NAND gate $40_0$ which drives word line $WL_1$, this other portion also including p-channel transistor 48b and n-channel transistor 49b connected in series similarly as transistors 48a, 49a, but which receive predecoded input signal $PDA_1$; parallel p-channel transistors 54b, 55b have their source/drain paths connected in parallel with that of transistor 48b, with their gates also controlled by predecoded signals $PDC_0$, $PDB_0$, respectively. Accordingly, a word line WL can be energized by the NAND of its associated predecoded signals PDA, PDB, PDC; for example, word line $WL_1$ can be driven by the NAND of predecoded signals $PDA_1$, $PDB_0$, $PDC_0$.

For each word line WL, fuse 42 is connected in series with each of the outputs of shared NAND gate 40, through which, when intact, the word line signal is driven, and by which, when open, the word line signal is disabled. Fuses 42 are conventional fuses used in the implementation of redundant elements in memory circuits, for example polysilicon fuses openable by energy from a laser beam. For example, fuse $42_0$ is connected to the common drain node of transistors 48a, 49a. The opposite side of each fuse 42 is coupled, via an inverter 45, to its associated word line WL. Small p-channel latching transistor 46 has its source/drain path connected between $V_{cc}$ and the input of its associated inverter 45, and has its gate coupled to the output of its associated inverter 45, and thus will serve to maintain the de-energized state of its associated word line WL unless the shared NAND gate 40 associated therewith overpowers the drive of transistor 46. As a result, the opening of fuse 42 for a word line WL disables the shared NAND gate 40 from controlling the state of its associated word line WL.

It is necessary that the word line WL remain in a de-energized state for any row which is disabled by the opening of its fuse 42. Accordingly, a p-channel transistor 44 is connected in parallel with each of the latching transistors 46, and which has its gate driven by line CEc; line CEc corresponds to a chip enable signal, which in this example is generated by the logical NAND of the state of two chip enable terminals (CE1, CE2) at the output of NAND function 41. Accordingly, when the memory is enabled by chip enable terminal CE1 high and chip enable terminal CE2 low, such that line CEc is low and transistors 44 are turned on, the state of each word line WL, including those having their fuses 42 blown, is set to the de-energized state. Transistors 44 (similarly as transistors 46) are preferably sufficiently small that shared NAND gates 40 can overpower their drive and pull the input of inverter 45 low for the one of word lines WL that is to be energized.

Specifications for modern low power memories, particularly SRAMs, require that there be no DC current path during standby, including those times during which the memory chip is not enabled. This is accomplished by the turning off of all transistors 44 responsive to a deselect state at the chip enable terminals CE1, CE2, causing line CEc to be high. In such a standby condition, the row address value for one row will be indicated as a low logic level at the output of its shared NAND gate 40, but no DC current will be drawn through an on transistor 44 and the n-channel transistors 49, 50, 52 in the selected shared NAND gate 40; for the selected word line WL, its latching transistor 46 will be off since its word line WL is energized. For all unselected word lines WL, p-channel transistors 46 will remain on, maintaining the de-energized state.

It has been observed, however, that the input to inverter 45 in the decoder of FIG. 1 can be placed in an indeterminate state on power-up for those rows which have their fuses 42 opened, such that disabled rows may have their word line WL energized on power-up. Once this occurs, during standby (i.e., line CEc high) or during the initial portion of the first access after standby (transistors 44 being relatively small), multiple word line selection can result, causing high current drain, access time push-out in the initial access, or other erroneous operation including circuit failure. It is therefore an object of the present invention to provide a memory having power-on reset control of word lines which are disconnected from the row decoder due to their being replaced by a redundant row.

It is a further object of the present invention to provide such a memory where the word lines include latches for maintaining a de-energized state on disabled word lines during normal operation.

It is a further object of the present invention to provide such a memory in which no DC current is drawn in the row selection circuitry during standby.

Other objects and advantages of the present invention will be apparent to those of ordinary skill in the art having reference to the following specification together with the drawings.

SUMMARY OF THE INVENTION

The invention may be incorporated into a memory where a power-on reset signal is used to set the state of all word lines at a point past a series fuse between the word line and the row decoder; the series fuse is used to disconnect the word lines for defective rows from the row decoder. As a result, the disabled word lines are forced to a de-energized state upon power-up, ensuring that multiple rows are not selected by an indeterminate power-up condition.

DETAILED DESCRIPTION OF THE PREFERRED EMBODIMENT

Figure 2:
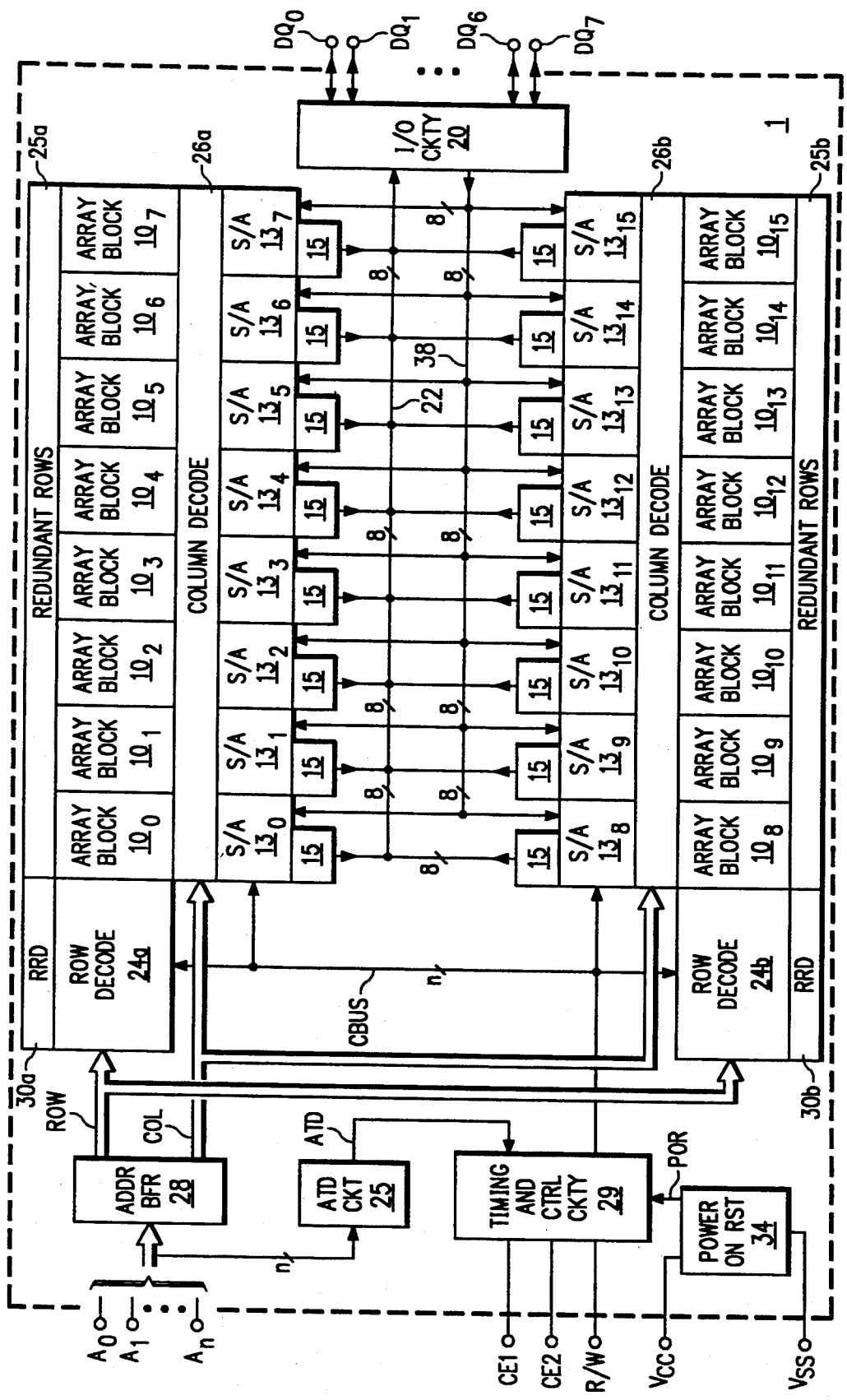
FIG. 2 is an electrical diagram, in block form, of a memory incorporating the preferred embodiment of the invention.

Referring now to FIG. 2, an example of an integrated circuit into which the preferred embodiment of the invention will be implemented will be described. In this example, memory 1 is a static random access memory (SRAM) of otherwise conventional architecture, having its memory cells in multiple blocks 10 which are shown, in FIG. 2, according to an example of their physical location in such a memory. It is contemplated that integrated circuits of other types which utilize long data conductors may also benefit from the present invention, such integrated circuits including microprocessors, logic devices, and other types of memories including read-only memories, FIFOs, DRAMs and the like.

As is conventional, memory cells in memory 1 are arranged in rows and columns, and are selected according to an address signal received at address terminals $A_0$ through $A_n$. Address terminals $A_0$ through $A_n$ are connected to address buffers 28, which buffer the received address signal and communicate a portion of the address signal to row decoders 24a, 24b on bus ROW, and communicate the remainder to column decoders 26a, 26b on bus COL. Row decoders 24a, 24b select a row of memory cells by enabling the selected word line, in the conventional manner, and are thus preferably located along a side of the memory array blocks 10. Column decoders 26a, 26b, in this example, select eight memory cells in the selected row to be sensed by a sense amplifier 13 according to the column portion of the address.

In memory 1 according to this example, the memory cells are grouped into sixteen array blocks $10_0$ through $10_{15}$. This partitioning of the memory into sixteen array blocks 10 is particularly beneficial in low power memories, such as may be used in portable computers, as only the block 10 in which the selected memory cells are located need be enabled during a cycle. Selection of the block may be done according to one of the row address bits (indicating upper or lower half) and to four of the column address bits (indicating one of sixteen array blocks 10 to be selected). Further reduction in the active power may be obtained by the implementation of latched row line repeaters between array blocks 10, as described in application Ser. No. 588,609, filed Sep. 26, 1990, assigned to SGS-Thomson Microelectronics, Inc., and incorporated herein by this reference.

Memory 1, as in the case of most modern SRAMs and DRAMs, includes some amount of dynamic operation, such as precharging and equilibration of certain nodes (e.g., bit lines) at particular points in the memory cycle. Initiation of the cycle in SRAM 1 occurs by way of address transition detection, performed by address transition detection (ATD) circuit 25. ATD circuit 25 is connected to each of the address inputs $A_0$ through $A_n$, preferably prior to address buffers 28 (as shown), and generates a pulse on line ATD responsive to detecting a transition at any one or more of address inputs $A_0$ through $A_n$, such a pulse useful in controlling the internal operation of memory 1 in the conventional manner, and also in the manner to be described hereinbelow.

Other internal operational functions are controlled by timing and control circuitry 29, which receives the signal on line ATD from ATD circuit 25, and which also receives certain external control signals such as the chip enable signal at terminals CE1, CE2, and the read/write select signal at terminal R/W_. Timing and control circuitry 29 generates various control signals based on these inputs, for control of the various functions within memory 1 in the conventional manner. As shown in FIG. 2, control bus CBUS is connected to row decoders 24a, 24b, for controlling their operation in the manner to be described hereinbelow.

Memory 1 in this example is of the byte-wide type, and as such it has eight input/output terminals $DQ_0$ through $DQ_7$ at which output data is presented during a read operation, and at which input data is received during a write operation. Input/output circuitry 20 is connected between output data bus 22 and input data bus 38, on the one hand, and terminals DQ, on the other hand, and includes conventional input and output buffers connected thereto. A preferred type of output buffer is described in application Ser. No. 07/809,387, filed Dec. 17, 1991, assigned to SGS-Thomson Microelectronics, Inc., and incorporated herein by this reference.

Each of array blocks $10_0$ through $10_{15}$ is associated with a corresponding group of sense/write circuits $13_0$ through $13_{15}$, as shown in FIG. 2. In this example, eight individual sense/write circuits are included within each group of sense/write circuits $13_0$ through $13_{15}$, one for each of the eight bits to be communicated on internal data bus 22 from the selected one of array blocks $10_0$ through $10_{15}$. Each of sense/write circuits 13 include both a sense amplifier and a write driver, as will be explained in further detail hereinbelow. Groups of data drivers 15 are each associated with a corresponding group of sense amplifiers $13_0$ through $13_{15}$ for receiving the data signal therefrom and for driving internal data bus 22 therewith; individual data drivers 15 are associated with individual sense/write circuits 13 in each group, one data driver 15 for driving each line in data bus 22. It is preferred that data drivers 15 have a high-impedance mode, to avoid bus conflict and to allow precharge, as described in application Ser. No. 07/809,735, filed Dec. 17, 199, assigned to SGS-Thomson Microelectronics, Inc., and incorporated herein by this reference.

In this example, the memory array is also divided into halves, with array blocks $10_0$ through $10_7$ in one array half and array blocks $10_8$ through $10_{15}$ in the other half. Internal data bus 22 runs the length of the array halves, and is located therebetween as shown in FIG. 2. Each individual data conductor in data bus 22 is connected to a corresponding data driver in each of the sixteen data driver groups 15 of the sixteen array blocks $10_0$ through $10_{15}$. For a read/write memory such as memory 1, input data bus 38 is also connected to each of sense/write circuits 13, for communicating input data, from terminals DQ via input/output circuitry 20 to be written to the selected memory cells in the conventional manner. Alternatively, the input data may also be communicated in time-multiplexed fashion along data bus 22, as is conventional for some memory designs.

For purposes of fast read access times, it may be preferred to also include, within data bus 22, one dummy data conductor associated with each of the data conductors, in the manner described in the above-referenced application Ser. No. 07/809,735. As described therein, each dummy data conductor is driven to a complementary state relative to its associated data conductor, such that precharging of the data conductors in data bus 22 can be accomplished by way of charge sharing between the two.

Memory 1 according to the present invention also includes power-on reset circuit 34. Power-on reset circuit 34 receives bias voltage from power supply terminal $V_{cc}$ (as of course do other portions of memory 1 by connections not shown), and generates a low logic level signal on line POR indicating that the $V_{cc}$ power supply has not yet reached a sufficient level upon memory 1 initially powering up (e.g., 2.5 volts or so); upon reaching the desired threshold, line POR is driven to a high logic level by power-on reset circuit 24. Line POR is connected to various portions of memory 1 in such a manner that certain nodes can be set to safe states prior to power-up, thus preventing the circuit from powering-up in an undesired state. As will be described hereinbelow, and as described in application Ser. No. 569,000, filed Aug. 17, 1990, incorporated herein by this reference, said application assigned to SGS-Thomson Microelectronics, Inc., power-on reset circuit 34 may similarly also control other portions of memory 1, as suggested by the connection of line POR to timing and control circuitry 29 in FIG. 2. Said copending application Ser. No. 569,000 also describes preferred configurations of power-on reset circuit 34, although for purposes of this invention conventional power-on reset circuits may also be used.

As noted above, for purposes of reducing power consumption, memory 1 according to this embodiment energizes only one of the sixteen array blocks 10, selected according to the column address. This is preferably performed in memory 1 by the use of a global word line driven by row decoders 24 which is gated to local row lines for each of array blocks 10 according to the column address. As a result, only that portion of the word line in the selected array block 10 is energized for the entire memory operation cycle, thus reducing the active power consumption of memory 1.

Alternatively, as described in application Ser. No. 588,609, filed Sep. 26, 1990, assigned to SGS-Thomson Microelectronics, Inc. and incorporated herein by this reference, latched repeaters may be included between array blocks 10, and also between row decoder 24 and each of adjacent array blocks $10_0$ and $10_8$, for maintaining the application of the energized row line within the selected array block 10 and, after a period of time, de-energizing the row line in the other array blocks 10, if desired. As is also described in application Ser. No. 588,609, if latched repeaters are so provided, the power-on reset signal on line POR may be coupled to each of the latched repeaters to ensure that the memory powers up with each of the local row lines de-energized, thus preventing against excessive DC power dissipation due to multiple memory cells being selected for a given bit line pair.

Of course, many alternative organizations of memory 1 may be used in conjunction with the invention described herein. Examples of such organizations would include by-one memories, where a single bit is input to or output from in normal operation. In addition, wide-word memories where each sub-array is associated with one of the input/output terminals, and memories where the entire array is energized during normal operation, may alternatively be used. As mentioned hereinabove, of course, other memory types such as dynamic RAMs, EPROMs, embedded memories, dual-port RAYs, FIFOs, and the like, each with organization of their own, may also benefit from this invention.

It should also be noted that other physical and electrical arrangements of array blocks 10 may be alternatively be used with the present invention. For example, two row decoders 24 may be incorporated into memory 1, each of which controls the application of a row line signal into half of the memory. Row decoder or decoders 24 may also be located along one edge of its associated array blocks 10, rather than in the middle thereof as shown in FIG. 2. It is contemplated that the particular layout of memory 1 will be determined by one of ordinary skill in the art according to the particular parameters of interest for the specific memory design and manufacturing processes.

Memory 1 according to this embodiment of the invention also includes redundant rows 25 which are associated with each of the array halves; for example, two redundant rows 25 may be provided for each array half, allowing for the replacement of up to four rows in memory 1. Redundant row decoders 30a, 30b energize the row line for the redundant rows 25 when the row address on bus ROW matches a pattern of fuses in redundant row decoders 30, in the conventional manner. As will be described in further detail hereinbelow, fuses are also provided within row decoders 24 for the primary word lines in array blocks 10, and which are opened to disable those of the primary rows that are replaced by one of redundant rows 25.

Figure 1:
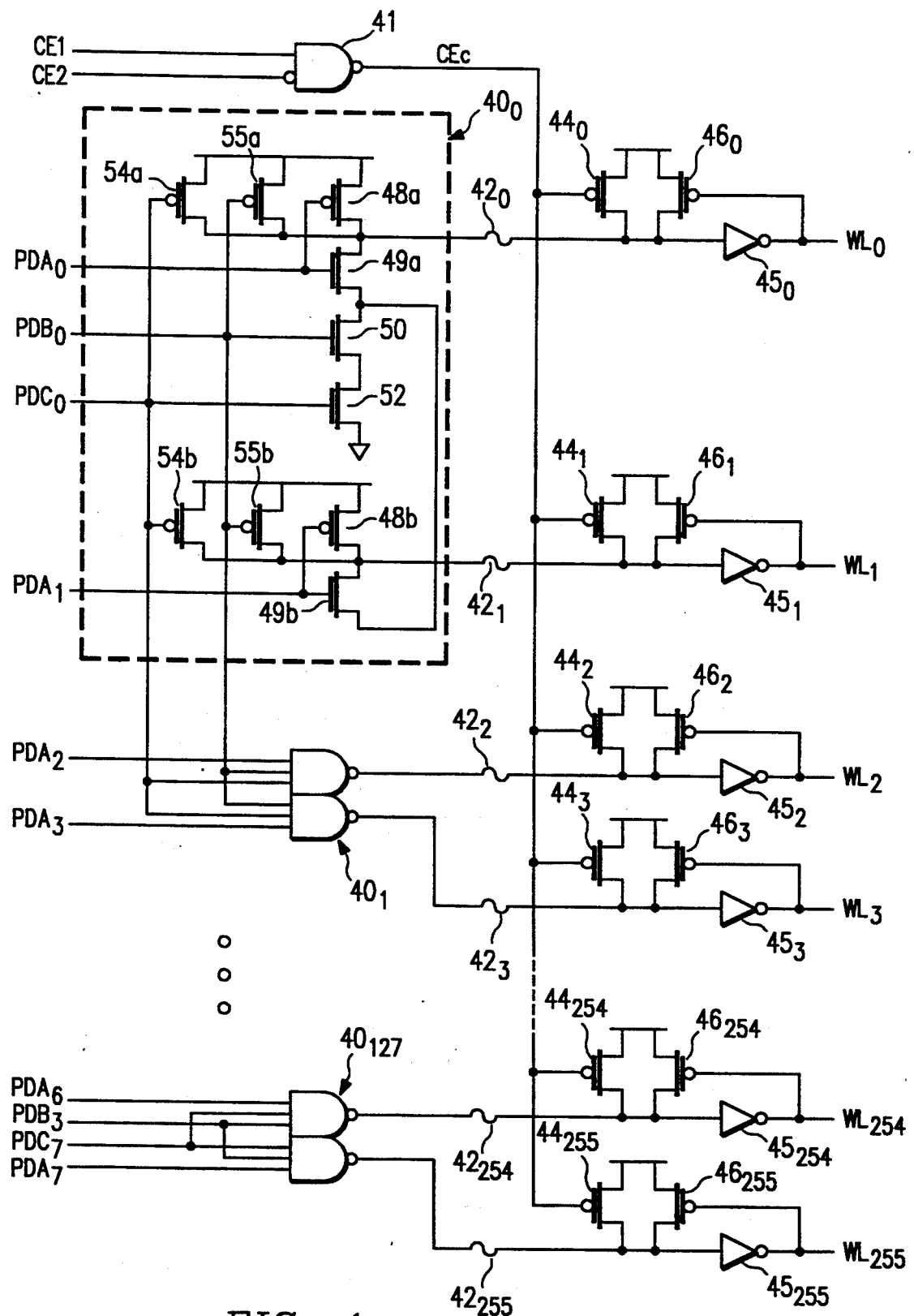
FIG. 1 is an electrical diagram, in block form, of a portion of a row decoder controlled according to the prior art.
Figure 3:
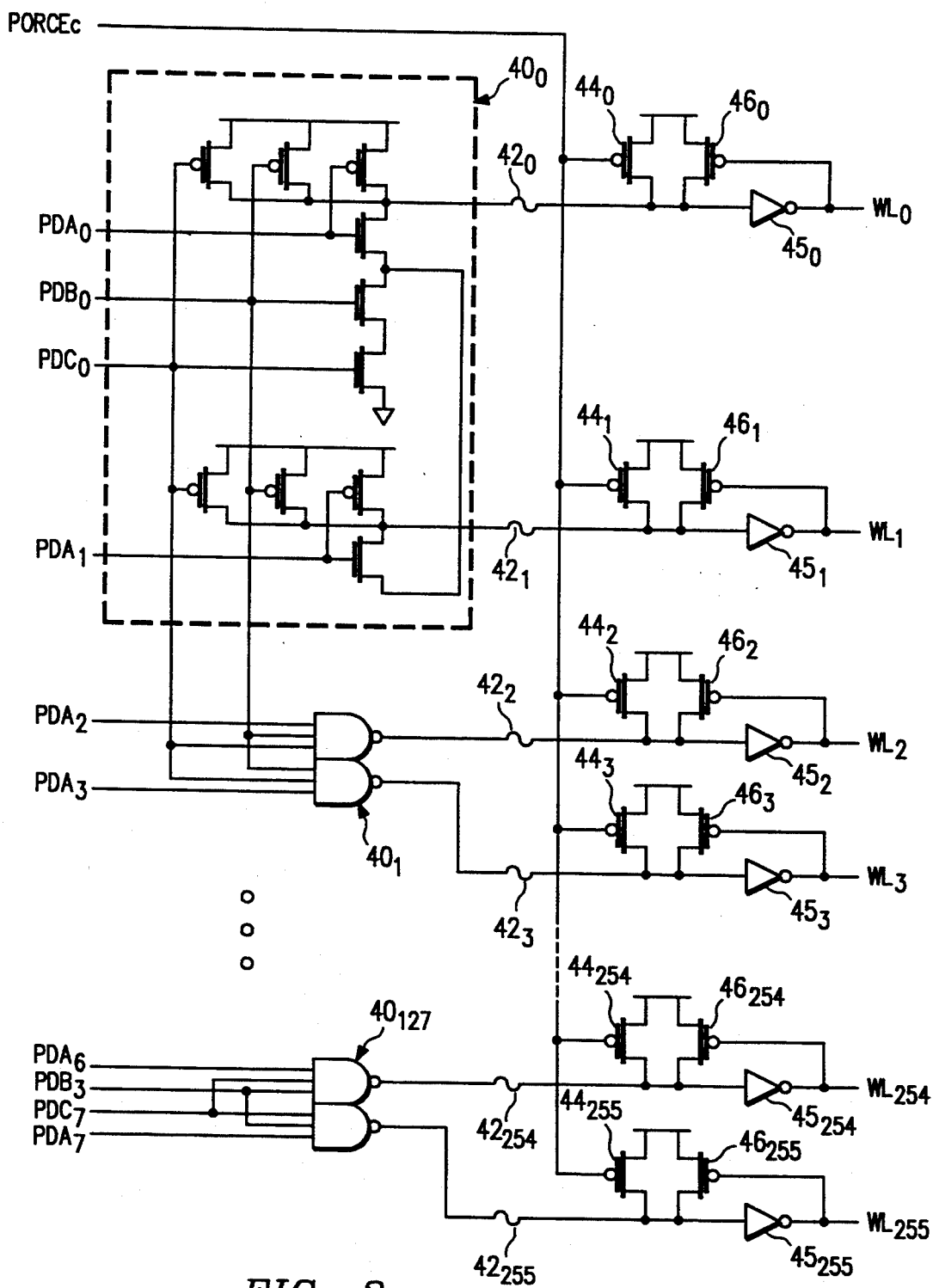
FIG. 3 is an electrical diagram, in schematic form, of a portion of a row decoder in the memory of FIG. 2.

Referring now to FIG. 3, a similar portion of the row decoder as discussed hereinabove relative to FIG. 1, but controlled according to the preferred embodiment of the invention, will now be described. Corresponding elements to the decoder shown in FIG. 1 are referred to in FIG. 3 by the same reference numerals, for clarity. The construction and operation of the portion of row decoder 24 shown in FIG. 3 is substantially identical to that of FIG. 1, with the exception that the gate of all of transistors 44 is controlled by a control signal communicated on line PORCEc. As will be evident hereinbelow, the signals on line PORCEc will ensure that any word line WL having its fuse 42 blown will be placed in a de-energized state upon power-up, preventing the condition where a disabled row is inadvertently energized on power-up and remains energized during standby due to its isolation from its shared NAND gate 40 (i.e., no address value can de-energize the word line WL when its fuse 42 is open).

Figure 4:
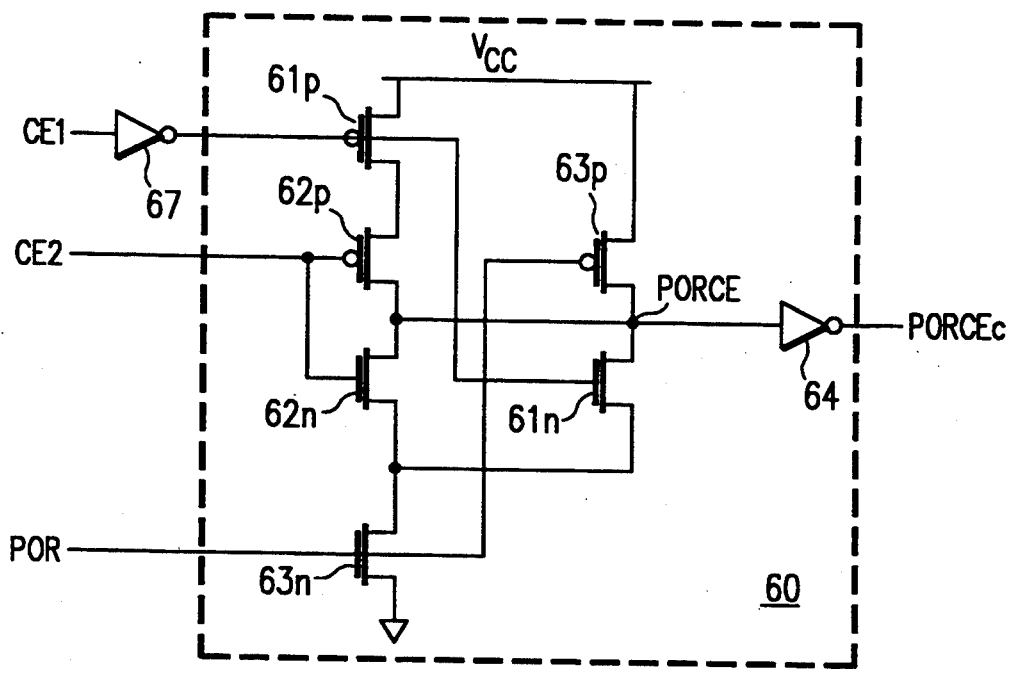
FIG. 4 is an electrical diagram, in schematic form, of a circuit for generating the control signal to the row decoder portion of FIG. 3.

Referring now to FIG. 4, circuit 60 for generating the de-energizing signal on line PORCEc will now be described in detail. Circuit 60 is preferably a portion of timing and control circuitry 29, and thus receives input signals from chip enable terminals CE1, CE2, and from power-on reset circuit 34. Similarly as described hereinabove relative to FIG. 1, memory 1 includes two chip enable terminals CE1, CE2; in this example, memory 1 is also to be enabled by the combination of a high logic level at terminal CE1 and a low logic level at terminal CE2. As such, circuit 60 includes p-channel transistors 61p, 62p having their source/drain paths in series between $V_{cc}$ and node PORCE, and which have their gates coupled (via a conventional input buffer, if desired) to chip enable terminals CE1 (via inverter 67), CE2, respectively. Circuit 60 also includes n-channel transistors 61n, 62n having their drains connected together at node PORCE, having their sources connected together, and having their gates coupled to chip enable terminals CE1 (via inverter 67), CE2, respectively. Circuit 60 further includes n-channel transistor 63n which has its drain connected to the sources of transistors 61n, 62n, has its source biased to ground, and has its gate connected to line POR; p-channel transistor 63p conversely has its drain connected to node PORCE and its source biased to $V_{cc}$, and also has its gate receiving line POR. Node PORCE is connected to the input of inverter 64, which drives line PORCEc connected to the gates of transistors 44 in the portion of row decoder 24 shown in FIG. 3.

In operation, after power-up, circuit 60 controls line PORCEc in the same manner as NAND gate 41 in FIG. 1, since line POR is at a high logic level after the $V_{cc}$ power supply reaches a certain threshold voltage, for example 2.5 volts. With line POR high after power-up, transistor 63n is on and transistor 63p is off, such that line PORCEc will be driven to an enabling low logic level only when terminal CE1 is high and terminal CE2 is low, by transistors 61p, 62p both on and transistors 61n, 62n both off. Any other logical combination at chip enable terminals CE1, CE2 will cause line PORCEc to be driven to the disabling high logic level.

Prior to the $V_{cc}$ power supply reaching its power-on threshold, however, line POR is driven to a low logic level by power-on reset circuit 34. This turns on transistor 63p and turns off transistor 63n, pulling node PORCE high and forcing line PORCEc to a low logic level. Referring back to FIG. 3, this will turn on all of transistors 44, including those for word lines WL which have their associated fuses 42 open. The input of all inverters 45 are then pulled toward the high level of $V_{cc}$, ensuring that all word lines WL, including those having their associated fuses 42 open, power-up in a de-energized state. Since the outputs of shared NAND gates 40 are disconnected from their associated word lines WL by the opening of fuses 42, the word lines WL for replaced rows will remain in the de-energized state by the latch of inverter 45 and latching transistor 46, even when memory 1 is disabled (and line PORCEc returns high again).

As a result of the present invention, therefore, the disabling and replacement of rows in primary array blocks 10 can be done without risk that a disabled word line can power-up in the on condition, such powering up causing temporary, and possibly permanent, functional failure.

It is contemplated that the present invention may be incorporated into integrated circuits having memories included therein, wherever an element such as a row, is disabled from operation by the opening of a fuse, such circuits including memory devices (such as DRAMs, SRAMs, FIFOs, ROMs, EPROMs, EEPROMs and the like), as well as microprocessors and other logic devices having memories embedded therein.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A semiconductor memory, comprising:

a power supply terminal for receiving a power supply voltage;

a plurality of primary memory cells arranged in rows and columns;

a decoder for selecting one of said plurality of primary memory cells according to an address value, said decoder driving a plurality of select lines at its output, each of said select lines associated with at least one of said primary memory cells;

a plurality of redundant memory cells;

a redundant decoder for selecting a redundant memory cell in lieu of one of said primary memory cells, responsive to a particular address value;

a plurality of fuses, each connected in series between said decoder and an associated one of said plurality of select lines, wherein one of said plurality of fuses is open so as to disconnect its associated select line from said decoder; and means for de-energizing the disconnected one of said plurality of select lines, responsive to said power supply voltage being below a threshold value.

2. The memory of claim 1, wherein said decoder comprises a row decoder, for selecting a row of said plurality of primary memory cells responsive to a row address;

wherein said plurality of select lines each correspond to a row of said plurality of primary of memory cells;

and wherein said plurality of redundant memory cells are arranged in a row.

3. The memory of claim 2, wherein said redundant decoder comprises a redundant row decoder, for selecting a row of said plurality of redundant memory cells responsive to a particular row address value.

4. The memory of claim 1, wherein each of said fuses, when open, disconnect said decoder from the select line to which it is connected.

5. The memory of claim 1, further comprising:

a plurality of latches, each having an input coupled to an associated one of said plurality of fuses and having an output coupled to an associated one of said plurality of select lines, for maintaining said select line in a de-energized state.

6. The memory of claim 5, wherein said de-energizing means comprises:

a plurality of de-energizing transistors, each having a conduction path coupled on one side to one of said select lines at a location beyond said fuse from said decoder, and coupled on another side to a de-energizing voltage, and each having a control terminal;

a power-on reset circuit, coupled to said power supply terminal, and having an output for indicating whether or not the voltage at said power supply terminal is below the threshold value; and control means, having an input coupled to the output of the power-on reset circuit and having an output coupled to the control terminal of each of said plurality of de-energizing transistors, for turning on each of the plurality of de-energizing transistors responsive to said power-on reset circuit indicating that the voltage at said power supply terminal is below the threshold voltage.

7. The memory of claim 6, wherein the input of each of said latches is coupled to the conduction path of an associated one of said plurality of de-energizing transistors.

8. The memory of claim 7, wherein each of said latches is an inverting latch.

9. The memory of claim 1, wherein said de-energizing means comprises:

a plurality of de-energizing transistors, each having a conduction path coupled on one side to one of said select lines at a location beyond said fuse from said decoder, and coupled on another side to a de-energizing voltage, and each having a control terminal;

a power-on reset circuit, coupled to said power supply terminal, and having an output for indicating whether or not the voltage at said power supply terminal is below the threshold value; and control means, having an input coupled to the output of the power-on reset circuit and having an output coupled to the control terminal of each of said plurality of de-energizing transistors, for turning on each of the plurality of de-energizing transistors responsive to said power-on reset circuit indicating that the voltage at said power supply terminal is below the threshold voltage.

10. A semiconductor memory comprising:

a power supply terminal for receiving a power supply voltage;

a plurality of primary memory cells arranged in rows and columns;

a decoder for selecting one of said plurality of primary memory cells according to an address value, said decoder driving a plurality of select lines at its output, each of said select lines associated with at least one of said primary memory cells;

a plurality of redundant memory cells;

a redundant decoder for selecting a redundant memory cell in lieu of one of said primary memory cells, responsive to a particular address value;

a plurality of fuses, each connected in series between one of said plurality of select lines and its associated primary memory cells, and each for disconnecting said decoder from the select line connected thereto;

a chip enable terminal for receiving a chip enable signal indicating whether or not said memory is to be enabled; and means for de-energizing each of said plurality of select lines responsive to said power supply voltage being below a threshold value, said de-energizing means being connected to each of said select lines at a location beyond said fuse from said decoder, said de-energizing means comprising:

a plurality of de-energizing transistors, each having a conduction path coupled on one side to one of said select lines at a location beyond said fuse from said decoder, and coupled on another side to a de-energizing voltage, and each having a control terminal;

a power-on reset circuit, coupled to said power supply terminal, and having an output for indicating whether or not the voltage at said power supply terminal is below the threshold value; and a logic function having a first input coupled to said chip enable terminal, having a second input coupled to the output of said power-on reset circuit, and having an output coupled to the control terminal of each of said plurality of de-energizing transistors, for turning on said plurality of de-energizing transistors responsive to either said power-on reset circuit indicating that the voltage at said power supply terminal is below the threshold voltage or said chip enable signal indicating that said memory is to be enabled, and for otherwise turning off said plurality of de-energizing transistors.

11. The memory of claim 10, further comprising:
a plurality of latches, each having an input coupled to an associated one of said plurality of fuses and having and output coupled to an associated one of said plurality of select lines, for maintaining said selected line in a de-energized state.

12. A method of operating an integrated circuit having memory, said memory having a plurality of redundant memory cells which can be accessed instead of a defective primary memory cell, responsive to the address of the defective primary memory cell, comprising:
disconnecting, from a decoder, a select line coupled to the defective primary memory cell, said decoder otherwise operable to select the defective primary memory cell by energizing the select line;
powering-up a power supply voltage received at a power integrated circuit;
detecting if the power supply voltage received at a power supply terminal is above or below a threshold voltage; and
responsive to the power supply voltage being below the threshold voltage, de-energizing the disconnected select line.

13. The method of claim 12, wherein said disconnecting step comprises:
opening a fuse connected in series between the decoder and the select line associated with the defective memory cell.

14. The method of claim 12, further comprising:
after said de-energizing step, latching the de-energized state on the disconnecting select line.

15. The method of claim 12, wherein said de-energizing step comprises:
turning on a de-energizing transistor having a conduction path coupled between the disconnected select line and a voltage that, when applied to said disconnected select line at the location of the transistor, de-energizes the select line.

16. The method of claim 15, further comprising:
after said de-energizing step, latching the de-energized state on the disconnected select line.

17. The method of claim 15, wherein each of the select lines in said memory is coupled to one end of the conduction path of an associated de-energizing transistor having its other end coupled to a voltage that, when applied to said disconnected select line at the location of the transistor, de-energizes the select line;
and further comprising:
turning on each of said de-energizing transistors during said de-energizing step.

18. A method of operating an integrated circuit having a memory, said memory, said memory having a plurality of redundant memory cells which can be accessed instead of a detective primary memory cells, responsive to the address of the defective primary memory cell, comprising:
disconnecting a select line coupled to the defective primary memory cell from a decoder, said decoder otherwise operable to select the defective primary memory cell by energizing the select line, wherein each of the select lines in said memory is coupled to one end of the conduction path of an associated de-energizing transistor having at its other end coupled to a voltage that, when applied to said disconnected selected line at the location of the transistor, de-energizes the select line;
powering-up a power supply voltage applied to said integrated circuit;
detecting if the power supply voltage received at a power supply terminal is above or below a threshold voltage; and
responsive to the power supply voltage being below the threshold voltage, de-energizing the disconnected select line by turning on a de-energizing transistor having a conduction path coupled between the disconnected select line and a voltage that, when applied to said disconnected select line at the location of the transistor, de-energizes the select line;
turning on each of said de-energizing transistors during said de-energizing step; and
responsive to a chip enable signal indicating selection of the memory, turning on each of said de-energizing transistors.

19. The method of claim 18, further comprising:
responsive to a chip enable signal indicating non-selection of the memory, turning off each of said de-energizing transistors.

* * * * *